(12) United States Patent
Tsai et al.

(10) Patent No.: US 11,348,868 B2
(45) Date of Patent: May 31, 2022

(54) CHANNEL STRUCTURE FOR SIGNAL TRANSMISSION

(71) Applicant: Wistron Corporation, New Taipei (TW)

(72) Inventors: Kun-Hung Tsai, New Taipei (TW); Yu-Jhan Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/950,860

(22) Filed: Nov. 17, 2020

(65) Prior Publication Data

US 2022/0115318 A1    Apr. 14, 2022

(30) Foreign Application Priority Data

Oct. 8, 2020 (TW) ................. 109134888

(51) Int. Cl.
*H01L 23/522* (2006.01)
*G06F 13/42* (2006.01)
*H01L 23/528* (2006.01)

(52) U.S. Cl.
CPC ...... *H01L 23/5226* (2013.01); *G06F 13/4221* (2013.01); *H01L 23/528* (2013.01); *H01L 23/5223* (2013.01); *H01L 23/5228* (2013.01)

(58) Field of Classification Search
CPC ............ H01L 23/5226; H01L 23/5223; H01L 23/5228; H01L 23/528; G06F 13/4221
USPC .................................................. 257/421, 774
See application file for complete search history.

(56) References Cited

U.S. PATENT DOCUMENTS

2021/0272892 A1* 9/2021 Zhang ............... H01L 23/49827

* cited by examiner

*Primary Examiner* — Tu-Tu V Ho
(74) *Attorney, Agent, or Firm* — Winston Hsu

(57) ABSTRACT

A channel structure for signal transmission is provided. The channel structure includes a first common pad, disposed on a first layer; a second common pad, disposed on a second layer; a via, for electrically connecting the first common pad and the second common pad; a first device path pad, disposed on the second layer and located in a first direction of the second common pad; and a second device path pad disposed on the second layer and located in a second direction of the second common pad. The channel structure includes a first electrical element electrically coupled between the second common pad and the first device path pad, or includes a second electrical element electrically coupled between the second common pad and the second device path pad.

8 Claims, 7 Drawing Sheets

CHANNEL STRUCTURE FOR SIGNAL TRANSMISSION

BACKGROUND OF THE INVENTION

1. Field of the Invention

The present invention relates to a channel structure for signal transmission, and more particularly, to a channel structure capable of maintaining high-speed signal quality and minimize circuit space.

2. Description of the Prior Art

In a channel structure for peripheral component interconnect express (PCIe), a host and a device transmit PCIe signals via a high speed differential transmission line, and an alternating current (AC) coupling capacitor is disposed in the channel in accordance with the specification. In practical design for a situation that the host is connected with only one of two devices via the channel, the prior art allows two device paths to be connected to the same interface of the host, and then to form only one complete device path between the two device paths to electrically connect to the host with a corresponding device. This design utilizes only one host interface, and wiring near the host could be shared to simplify the overall design.

In practice, by disposing an element on a specific device path to form a complete device path and appropriate layout, the host may be connected with a specific one of the two devices via the channel. However, under the design of high-speed signals, signal integrity is susceptible to channel structure, and signal quality may be degraded after the signals pass the channel structure.

In view of this, it is necessary to improve the prior art.

SUMMARY OF THE INVENTION

It is therefore an objective of the present invention to provide a channel structure capable of maintaining high-speed signal quality and minimize circuit space.

The present invention discloses a channel structure for signal transmission. The channel structure includes a first common pad, disposed on a first layer; a second common pad, disposed on a second layer; a via, for electrically connecting the first common pad and the second common pad; a first device path pad, disposed on the second layer and located in a first direction of the second common pad; and a second device path pad disposed on the second layer and located in a second direction of the second common pad. The channel structure further includes a first electrical element electrically coupled between the second common pad and the first device path pad, or further includes a second electrical element electrically coupled between the second common pad and the second device path pad.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
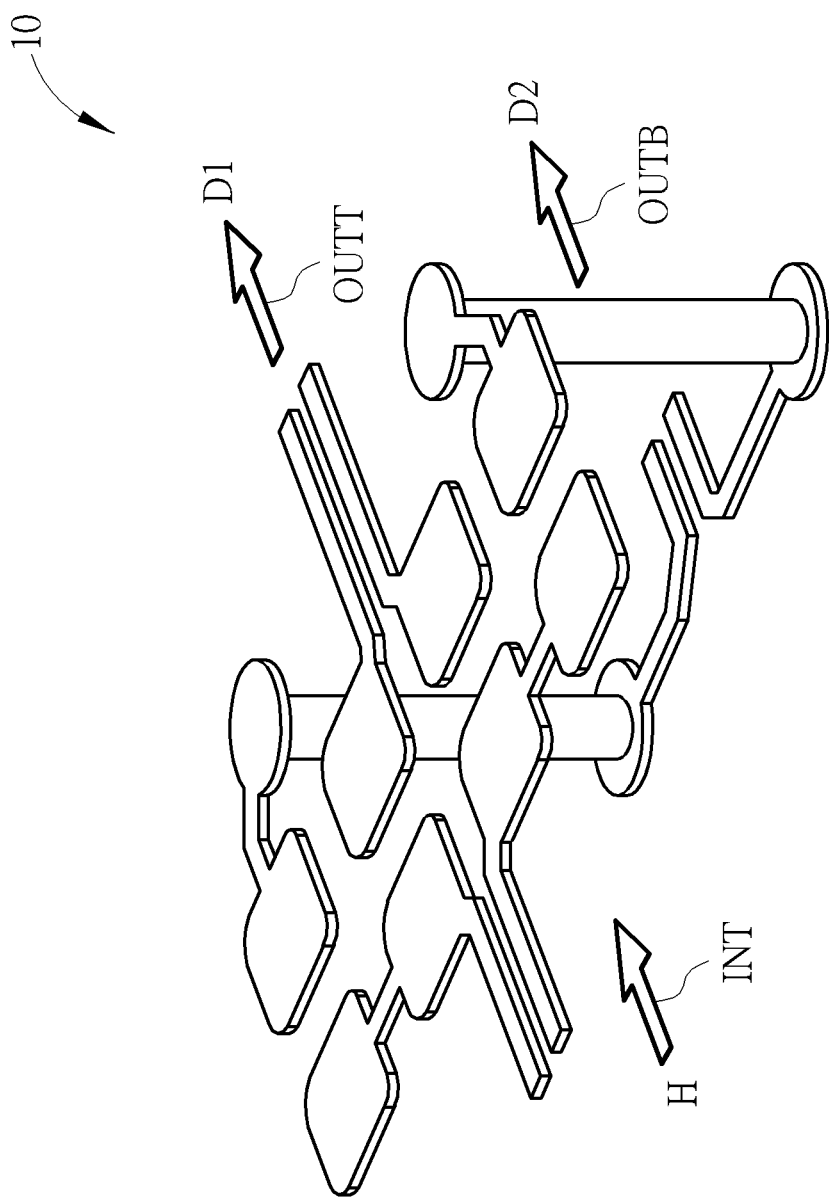
FIG. 1A is a side view of a channel structure.
Figure 1B:
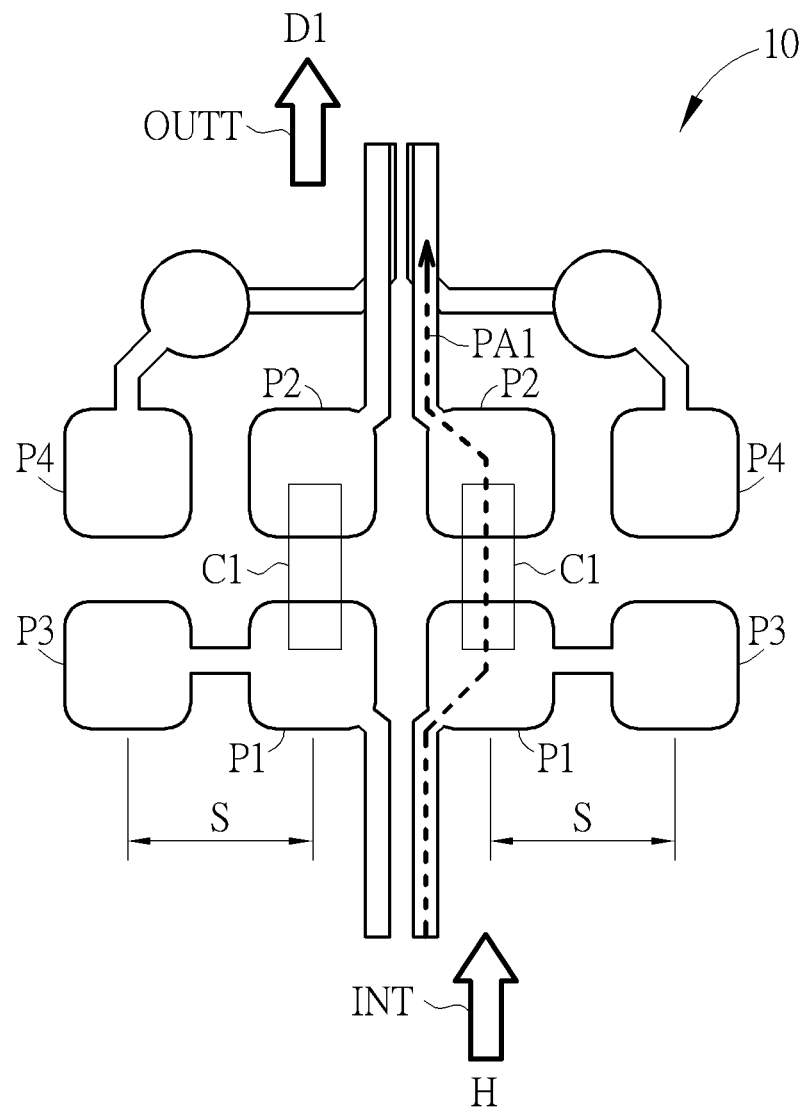
FIGS. 1B and 1C are top views of different complete device paths of the channel structure.
Figure 1C:
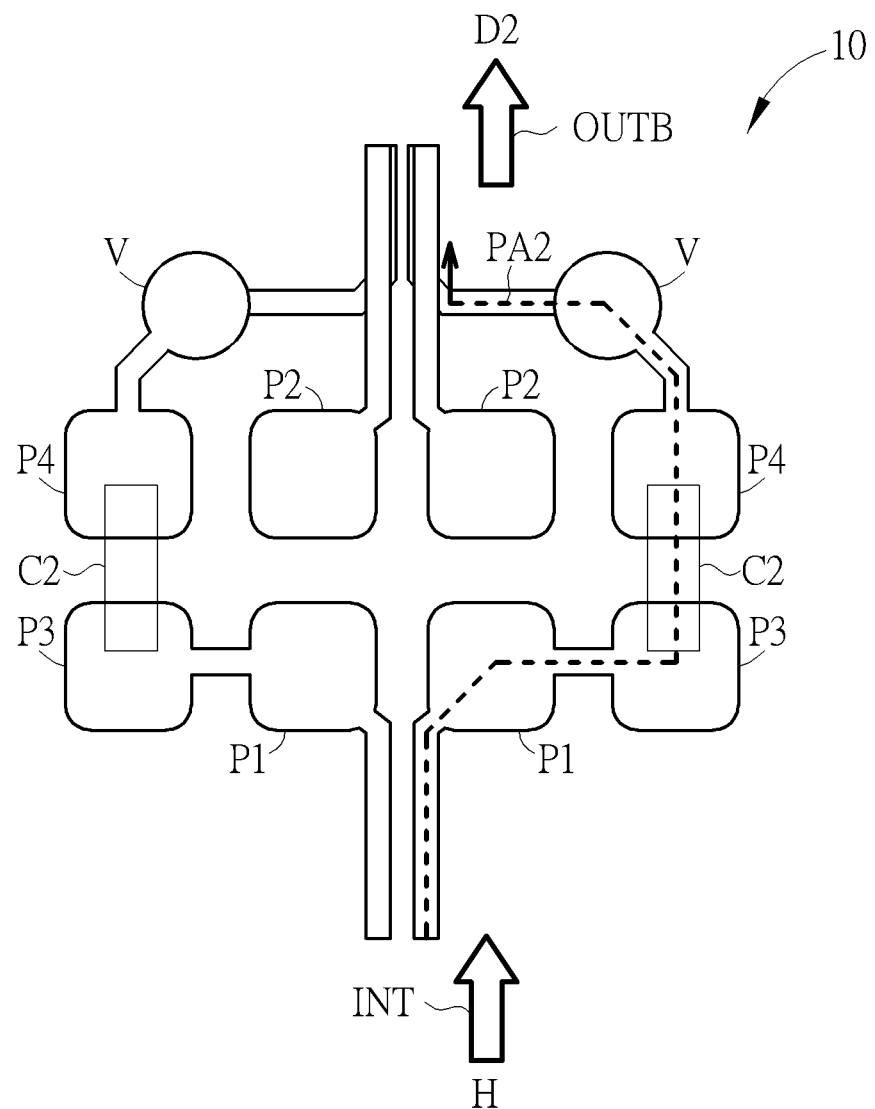

Please refer to FIG. 1A to FIG. 1C. FIG. 1A is a side view of a channel structure 10, and FIGS. 1B and 1C are top views of different complete device paths of the channel structure 10. FIG. 1A illustrates a basic structure that no element is disposed between a top input INT (coupled to a host H) and a top output OUTT (coupled to a device D1) or a bottom output OUTB (coupled to a device D2), to forma complete device path. In this configuration, as shown in FIG. 1B, when two capacitors C1 are disposed (e.g., by soldering the capacitors C1) between inner two pads P1 and P2 of the channel structure 10, a complete device path PA1 is formed between the host H and the device D1 via a pad P1, the capacitor C1 and a pad P2. On the other hand, as shown in FIG. 1C, when two capacitors C2 are disposed between outer pads P3 and P4 of the channel structure 10, a complete device path PA2 is formed between the host H and the device D2 via the pad P1, the pad P3, the capacitor C2, the pad P4 and a via V.

In this structure, when the channel structure 10 forms the complete device path PA1, both of a stubs S (where signals should not pass) beside the pad P1 and capacitance effect of the empty pad P3 affect high frequency characteristics. On the other hand, when the channel structure 10 forms the complete device path PA2, the complete device path PA2 needs to pass through the empty pad P1 and change layers through the via V, and the complete device path PA2 routes outwardly, such that differential lines separated by a larger distance cannot be maintained. Therefore, high frequency characteristics of the complete device path PA2 is worse than that of the complete device path PA1, and both the asymmetrical complete device paths PA1, PA2 need to be analyzed. As a result, the channel structure 10 may affect system reliability and design flexibility.

Figure 2A:
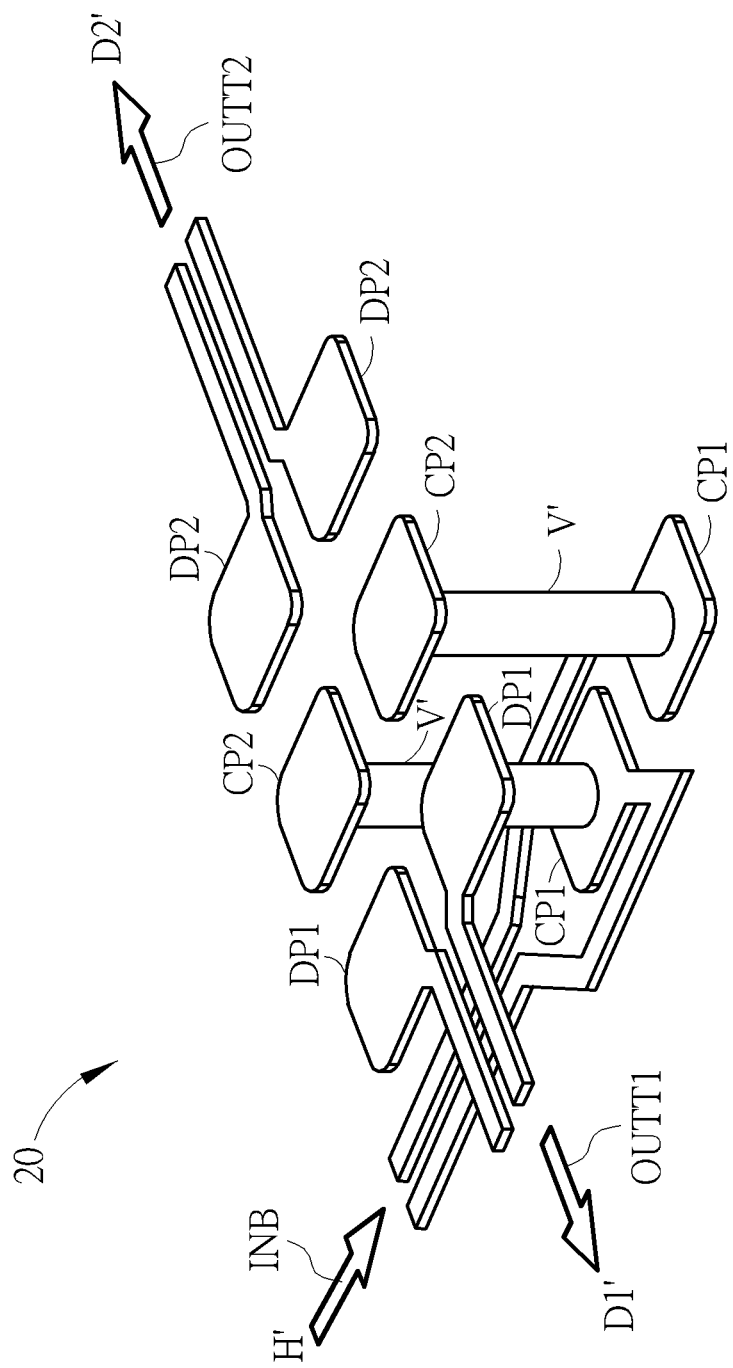
FIG. 2A is a side view of a channel structure according to an embodiment of the present invention.
Figure 2B:
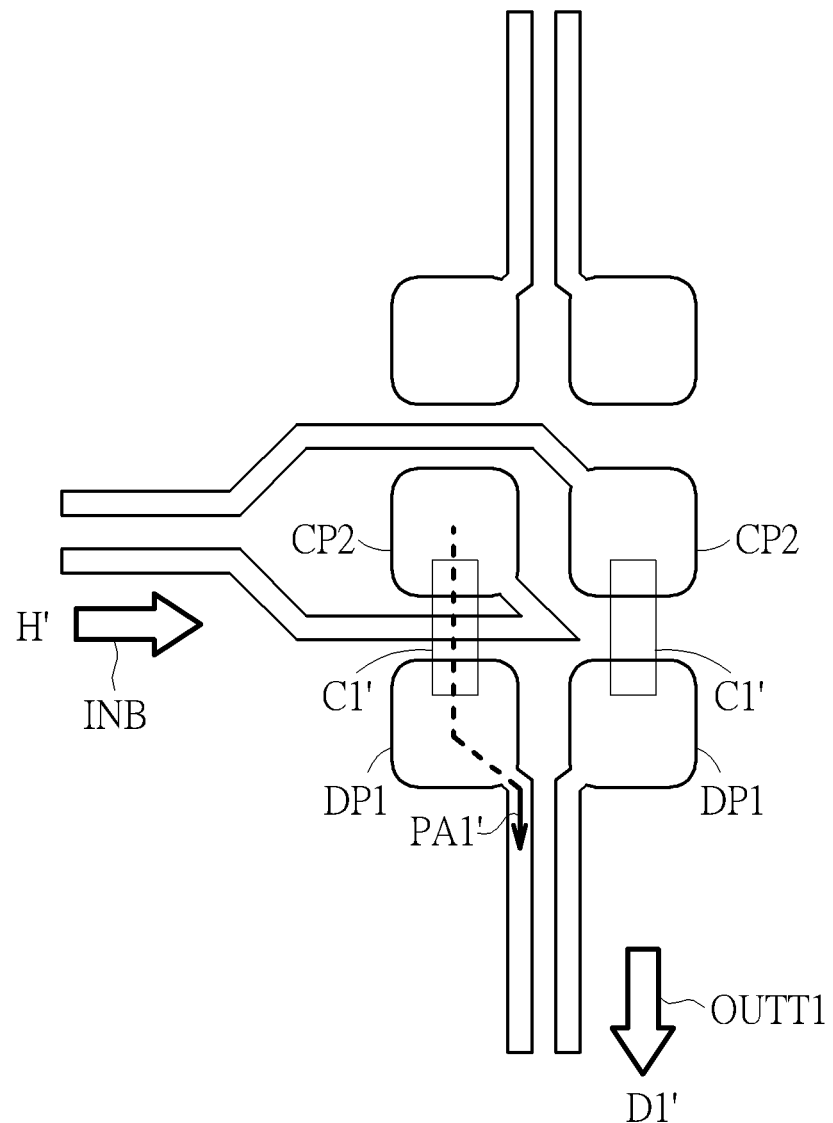
FIGS. 2B and 2C are top views of different complete device paths of the channel structure shown in FIG. 2A according to an embodiment of the present invention.
Figure 2C:
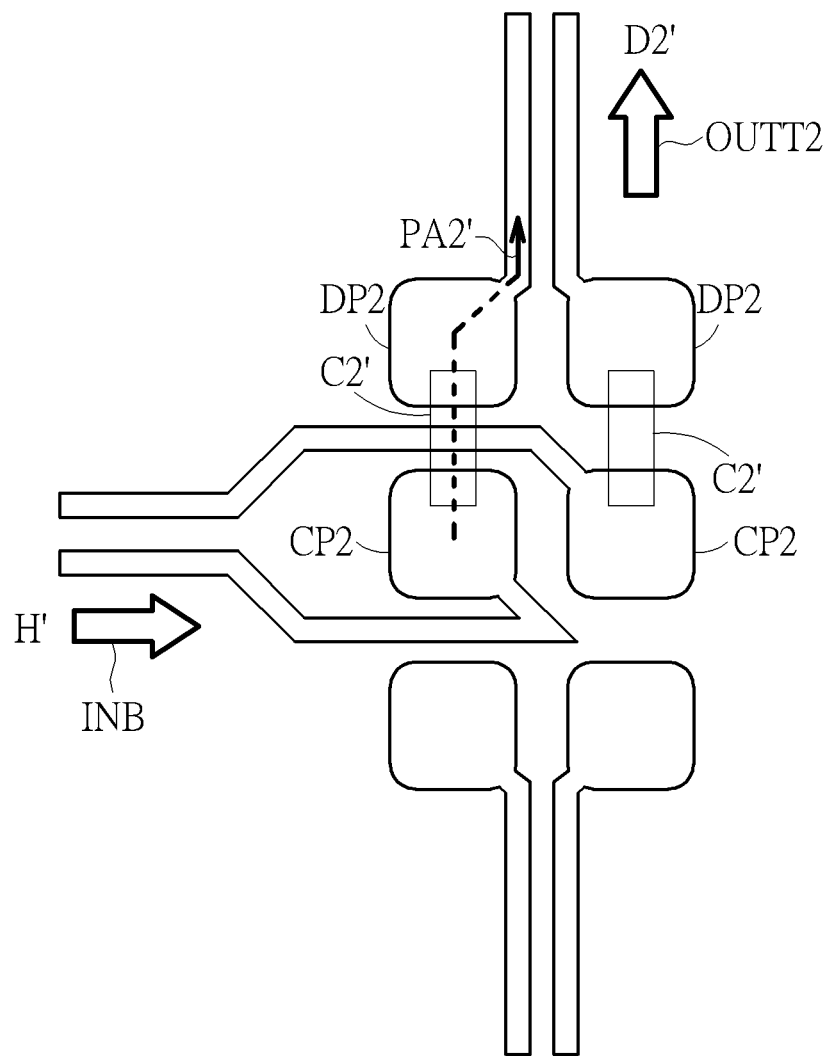

Please refer to FIG. 2A to FIG. 2C. FIG. 2A is a side view of a channel structure 20 according to an embodiment of the present invention. FIGS. 2B and 2C are top views of different complete device paths of the channel structure 20 according to an embodiment of the present invention. FIG. 2A illustrates a basic structure that no element is disposed between a bottom input INB (coupled to a host H') and an top output OUTT1 (coupled to a device D1') or an top output OUTT2 (coupled to a device D2'), to form a complete device path. The channel structure 20 includes common pads CP1, CP2, vias V', and device path pads DP1, DP2. The common pads CP1 are disposed on a first layer (such as a bottom layer) and is electrically connected to the bottom input INB, and the common connection pads CP2 are disposed on a second layer (such as a top layer). The vias V' electrically connect the common pads CP1 and CP2, so that elements of the first layer and the second layer may be electrically connected via a via-in-pad structure formed by the common pads CP1, CP2 and the vias V'. The device path pads DP1 are disposed on the second layer and located in a first direction of the common pads CP2, while the device path pads DP 2 are disposed on the second layer and located in a second direction of the common pads CP2. The second direction is an opposite direction of the first direction, and the first direction and the second direction are substantially perpendicular to a signal input direction of the bottom input INB.

In this configuration, as shown in FIG. 2B, the channel structure 20 may include electrical elements C1' electrically coupled (for example, by soldering the electrical elements C1') between the common pads CP2 and the device path pads DP1, to form a complete device path PA1' between the host H' and the device D1' through the common pad CP1, the via V', the common pad CP2, the electrical element C1' and the device path pad DP1. On the other hand, as shown in FIG. 2C, the channel structure 20 may include electrical elements C2' electrically coupled (for example, by soldering the electrical elements C2') between the common pads CP2 and the device path pads DP2, to form a complete device path PA2' between the host H' and the device D2 through the common pad CP1, the via V', the common pad CP2, the electrical element C2' and the device path pad DP2. In this way, the present invention may connect the host to one of the two devices with a simplified circuit structure, and may improve the adverse effects of high-frequency characteristics.

In detail, compared with the asymmetric complete device paths PA1, PA2 of the channel structure 10, the complete device paths PA1', PA2' of the channel structure 20 form a symmetrical structure and have substantially opposite directions with respect to the signal input direction. Therefore, signal characteristics of the complete device paths PA1', PA2' are quite similar, thereby simplifying the overall system design without analyzing two channels, respectively. Besides, when one of the complete device paths PA1', PA2' is utilized, another one of the complete device paths PA1', PA2' (i.e., not utilized) does not form a stub or an empty pad, and therefore does not affect the frequency characteristics of the utilized channel. Furthermore, the complete device paths PA1', PA2' share the via-in-pad structure formed by the common pads CP1, CP2 and the vias V', and therefore the channel structure 20 occupies a smaller space.

Notably, the above embodiment shares the via-in-pad structure formed by the common pads CP1, CP2 and the vias V', and disposes the electrical elements C1', C2' in different directions to form the substantially symmetric complete device paths PA1, PA2, to simplify the circuit and improve high-frequency characteristics. Those skilled in the art may make modifications or alterations accordingly, but not limited to this. For example, the channel structure 20 may be utilized in Peripheral Component Interconnect Express (PCIe) channel, but can also be utilized in other signal channels. Furthermore, in the PCIe channel, an alternating current (AC) coupling capacitor may be disposed in accordance with the specification, so that the electrical elements C1' and C2' may be realized by capacitors. In other embodiments, the electrical elements C1' and C2' may also be realized by resistors. Besides, the channel structure 20 may be utilized for high-speed differential signal transmission, and thus the above embodiment illustrates paired pads, vias, and wires. In other transmission manners, the channel structure may be implemented by non-paired pad, via, and wire. In addition, the second direction in the above embodiment is the opposite direction of the first direction, and the first direction and the second direction are substantially perpendicular to the signal input direction, to form the substantially symmetric complete device paths PA1, PA2. In other embodiments, the first direction and the second direction may only form a substantially symmetric structure, but it is not limited thereto.

On the other hand, in the above embodiment, the channel structure 20 is utilized for high-speed signal transmission, and thus only one of the electrical elements C1', C2' is disposed, to form a complete device path between the host H' and one of the devices D1', D2'. In low-speed signal transmission, both of the same electrical elements C1', C2' are disposed, to form complete device paths between the host H' and both of the devices D1', D2'. In addition, in the above embodiment, the first layer for signal input is illustrated as the bottom layer, and the second layer for signal output and disposing the electrical elements C1' and C2' is illustrated as the top layer. In other embodiments, signals may also be inputted from an inner layer of a multilayer design. If signals are outputted by an inner layer, since the second layer for disposing the electrical elements C1', C2' needs to be an top layer, the channel structure 20 needs to further include an output via electrically coupled between a third layer (i.e., the inner layer) and the device path pad DP1 or the device path pad DP2 of the second layer, to output signals by the third layer.

Output performances of the complete device paths PA1, PA2 of the channel structure 10 and the complete device paths PA1', PA2' of the channel structure 20 are compared as follows. By observation of the channel structures 10, 20, the complete device path PA1' further includes the via V' but does not include the stub S and the empty pad P3 in comparison with the complete device path PA1, and the complete device path PA2' does not include the pad P1 and outer wiring in comparison with the complete device path PA2, and the complete device paths PA1, PA2 are substantially symmetric and output signals in the same layer. Therefore, it may be expected that the complete device path PA2' has more improves over the complete device path PA2, while high frequency characteristics of the complete device path PA1' is affected due to the extra via V'.

Figure 3:
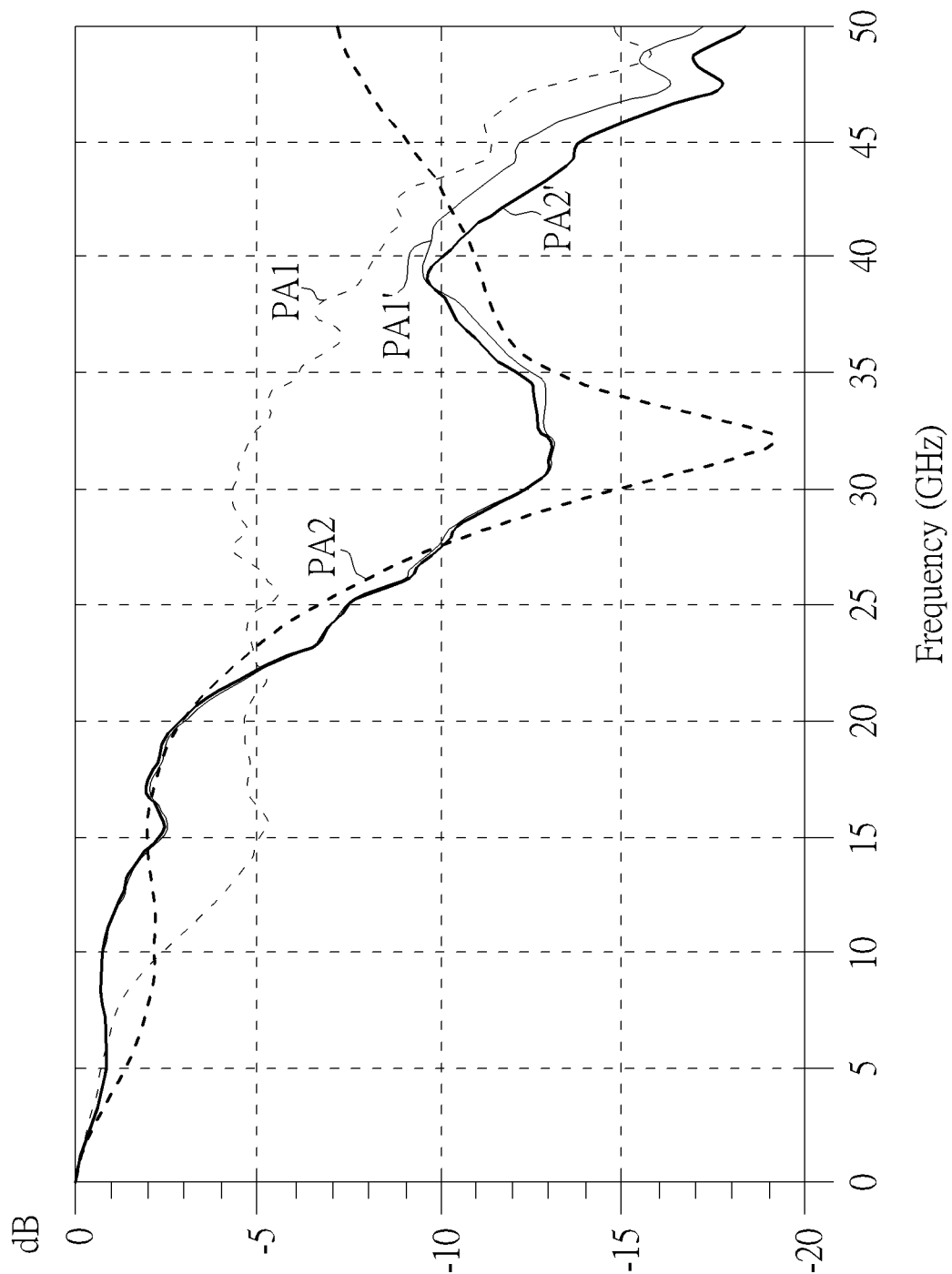
FIG. 3 is a schematic diagram of simulation of input losses of different complete device paths.

Specifically, please refer to FIG. 3, which is a schematic diagram of simulation of input losses of the complete device paths PA1, PA2, PA1', PA2'. As shown in FIG. 3, since the complete device paths PA1' and PA2' of the channel structure 20 are substantially symmetric, outputs of the complete device paths PA1' and PA2' have very consistent characteristics at all frequencies as expected. Besides, characteristics of the complete device paths PA1', PA2' below 6 GHz are similar to that of the complete device path PA1, but characteristics of the complete device paths PA1', PA2' above 22 GHz are worse than that of the complete device path PA1 due to the extra via V'. Furthermore, characteristics of the complete device paths PA1' and PA2' below 3 GHz are similar to characteristics of the complete device path PA2, but characteristics of the complete device paths PA1' and PA2' above 3 GHz are better.

In this case, the complete device paths PA1', PA2' are suitable for low or high speed signals, and do not have obvious influences on common high-speed signals. Only applications for higher-speed signals (e.g., 20 Gbps or more), design of pads and vias need adjustment for optimization. Further, for third-generation design of PCIe, characteristic below 4 GHz (i.e. Nyquist Frequency) is quite important, output of the complete device path PA2 is influenced here, and will be more obviously influenced for higher-speed signals in the future. In contrast, the complete device paths PA1' and PA2' can maintain the output very well, and the output drops significantly only until 10 GHz, thereby having better performance in common high-speed signal applications.

In summary, the present invention shares the via-in-pad structure formed by the common pads CP1, CP2 and the vias V', and disposes the electrical elements C1', C2' in different directions to form the substantially symmetric complete device paths PA1, PA2, to simplify the circuit and improve high-frequency characteristics.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A channel structure, for signal transmission, comprising:
    a first common pad, disposed on a first layer;
    a second common pad, disposed on a second layer;
    a via, for electrically connecting the first common pad and the second common pad;
    a first device path pad, disposed on the second layer and located in a first direction of the second common pad; and
    a second device path pad, disposed on the second layer and located in a second direction of the second common pad;
    wherein the channel structure further comprises a first electrical element electrically coupled between the second common pad and the first device path pad, or further comprises a second electrical element electrically coupled between the second common pad and the second device path pad;
    wherein the second direction is an opposite direction of the first direction, and the first direction and the second direction are substantially perpendicular to a signal input direction to form substantially symmetric complete device paths.

2. The channel structure of claim 1, wherein the channel structure is for a peripheral component interconnect express (PCIe) channel.

3. The channel structure of claim 1, wherein the first electrical element or the second electrical element is a capacitor or a resistor.

4. The channel structure of claim 1, wherein the channel structure is for high speed differential signal transmission.

5. The channel structure of claim 1, wherein the channel structure comprises both of the first electrical element and the second electrical element.

6. The channel structure of claim 1, wherein the first layer is a bottom layer, and the second layer is a top layer.

7. The channel structure of claim 1, wherein the channel structure further comprises an output via, electrically coupled between a third layer and the first device path pad or the second device path pad of the second layer.

8. The channel structure of claim 7, wherein the third layer is an inner layer.

* * * * *